US006969891B1

(12) United States Patent
Leroux

(10) Patent No.: US 6,969,891 B1
(45) Date of Patent: Nov. 29, 2005

(54) DEVICE PROVIDING PROTECTION AGAINST ELECTROSTATIC DISCHARGES FOR MICROELECTRONIC COMPONENTS ON A SOI-TYPE SUBSTRATE

(75) Inventor: Charles Leroux, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/889,558

(22) PCT Filed: Jan. 28, 2000

(86) PCT No.: PCT/FR00/00198

§ 371 (c)(1),
(2), (4) Date: Aug. 3, 2001

(87) PCT Pub. No.: WO00/45439

PCT Pub. Date: Aug. 3, 2000

(30) Foreign Application Priority Data

Jan. 29, 1999 (FR) .................................. 99 01032

(51) Int. Cl.⁷ ............................................ H01L 23/62
(52) U.S. Cl. .................................................. 257/355
(58) Field of Search ................................. 257/321, 316, 257/317, 318, 320, 319, 322, 323, 355, 350, 257/347, 546, 369, 507, 106, 173, 175, 199, 257/481, 603; 365/185, 900; 327/194, 326, 327/421

(56) References Cited

U.S. PATENT DOCUMENTS

| 3,728,591 | A | | 4/1973 | Sunshine |
| 4,982,371 | A | * | 1/1991 | Bolan et al. ................. 235/492 |
| 5,210,846 | A | * | 5/1993 | Lee ............................. 235/492 |
| 5,343,053 | A | * | 8/1994 | Avery .......................... 257/173 |
| 5,365,099 | A | * | 11/1994 | Phipps et al. ................ 257/328 |
| 5,536,958 | A | * | 7/1996 | Shen et al. ................... 257/356 |
| 5,548,146 | A | * | 8/1996 | Kuroda et al. ............... 257/316 |
| 5,610,790 | A | * | 3/1997 | Staab et al. .................... 361/56 |
| 5,708,288 | A | * | 1/1998 | Quigley et al. .............. 257/355 |
| 5,736,779 | A | * | 4/1998 | Kobayashi .................... 257/603 |
| 6,157,530 | A | * | 12/2000 | Pequignot et al. ........... 361/111 |
| 6,217,213 | B1 | * | 4/2001 | Curry et al. .................. 368/202 |
| 6,330,977 | B1 | * | 12/2001 | Hass et al. .................... 235/487 |
| 6,479,883 | B1 | * | 11/2002 | Chen et al. ................... 257/546 |

FOREIGN PATENT DOCUMENTS

| DE | 31 42 591 | 10/1982 |
| EP | 0 263 711 | 4/1988 |
| WO | WO 97/35373 | 9/1997 |

OTHER PUBLICATIONS

Cohen, Seymour H. et al., An Improved Input Protection Circuit for C-MOS/SOS Arrays; Aug. 1978. IEEE Transactions of Electron Devices, vol. 25, No. 8. pp 926-932.*
S. Voldman, et al., EOS/ESD Symposium, pps. 210-220, "Dynamic Threshold Body-and Gate-Coupled SOI ESD Protection Networks," 1997.

* cited by examiner

*Primary Examiner*—Carl Whitehead, Jr.
*Assistant Examiner*—Jennifer M Dolan
(74) *Attorney, Agent, or Firm*—Oblon, Spivak, McClelland, Maier & Neustadt, P.C.

(57) ABSTRACT

A device for the protection of an electronic component against electrostatic discharges. The device is made in a semiconducting layer of a substrate. The semiconducting layer covers an insulating layer. The device is connected to a contact pin to protect the electric component in order to divert an electrostatic discharge. The device includes at least one Zener diode connected to the pin to be directly polarized.

7 Claims, 3 Drawing Sheets

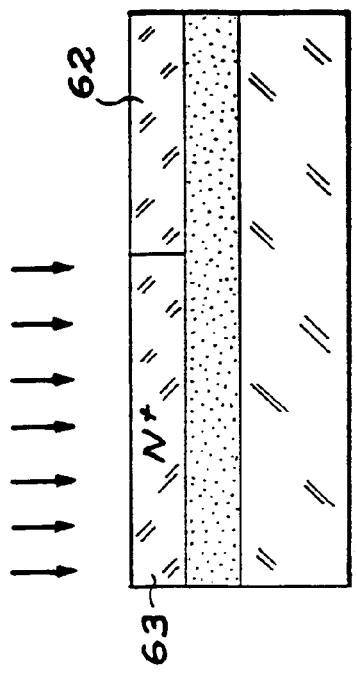
FIG. 9
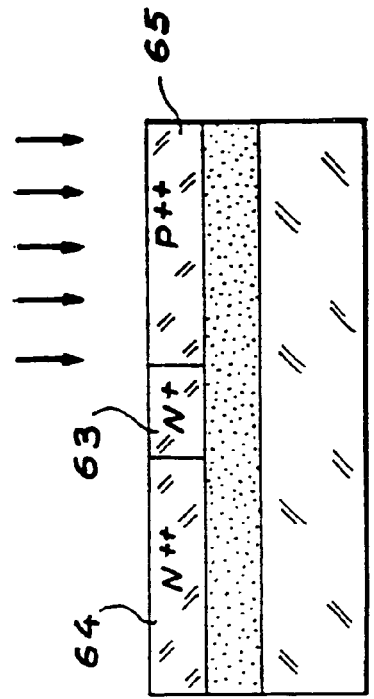
FIG. 11
FIG. 8
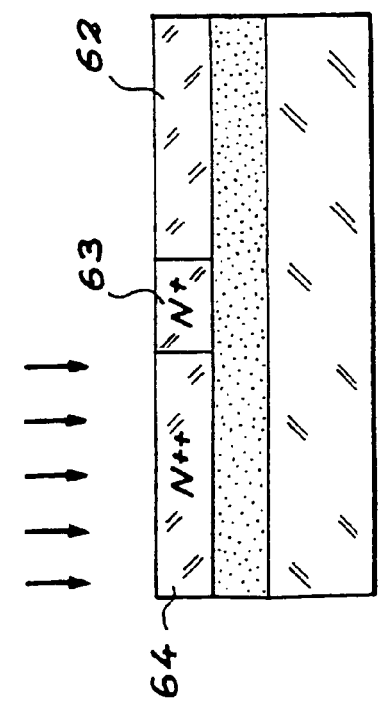
FIG. 10

DEVICE PROVIDING PROTECTION AGAINST ELECTROSTATIC DISCHARGES FOR MICROELECTRONIC COMPONENTS ON A SOI-TYPE SUBSTRATE

TECHNICAL FIELD

This invention relates to a device for protection against electrostatic discharges for electronic components made on a substrate comprising a semiconducting layer on an insulating layer, for example an SOI substrate.

Protection against electrostatic discharges (ESD) has an important influence on the reliability of electronic systems. According to some sources, losses caused by electrostatic discharges account for an average loss of products varying between 8 and 33%. Protection against these nuisances is necessary at all levels; manufacturing and operating environment of integrated circuits, protection on cards combining several integrated circuits. Part of the protection is provided by the circuit itself.

The various integrated circuits used in electronic systems are connected to their environment through their input-output or power supply pins, and therefore if an electrostatic discharge (ESD) occurs, it can be passed through these pins. The main principle for protection on the circuit is then to put protection structures between these pins and their power supplies at each input-output pin around the periphery of the circuit. These protective structures are usually inverse diodes, blocked MOS transistors or thyristors. These devices must not disturb operation of the circuit and must behave like open switches during normal operation in order to directly divert the minimum amount of input-output current that forms the vector for carrying information in the circuit, to the circuit power supplies. On the other hand when a discharge occurs, they must behave like closed switches to prevent the electrostatic discharge from degrading the internal part of the circuit. If a discharge occurs, and if the protection really operates like an ideal switch, in other words a zero resistance series switch, the electrostatic discharge will flow through the circuit without any loss of energy and therefore without deterioration. The electrostatic discharge voltage resisted by the protection device without being damaged is called the intrinsic withstand.

STATE OF PRIOR ART

The switch analogy is an ideal case, and an attempt will be made to approach this ideal case. In practice, protection is characterized by its electrical characteristic hold voltage in triggered mode and its resistance in series. Therefore, optimising protection means minimizing the size of the structure, with a minimum resistance in series and for which the hold voltage is minimized, although remaining greater than the circuit operating voltage. The reduction in the surface area occupied by the protection structure and the reduction in its resistance are usually contradictory, and a compromise has to be reached between these two factors.

At the present time, integrated circuits operating at increasing low voltages (less than 3 V and even less than 2 V) can now be made. The maximum allowable voltages are also lower and optimisation of the series resistance of protection structures, and achieving an optimum hold voltage become essential challenges.

Protection structures using several directly polarized diodes have been used within this context of protection of low voltage circuits. The hold voltage is defined as a first approximation by the diode elbow voltage (about 0.7 V) multiplied by the number of diodes in series.

The use of this type of protection by diodes in series creates difficulties on a classical silicon substrate due to the fact of a parasite effect commonly called the Darlington effect. On this type of substrate, each protection diode is made in a compartment with doping type opposite to the doping type of the substrate, each compartment being isolated from the others, the diodes then being connected in series. Since the substrate is solid, a parasite bipole transistor is connected to each protection diode. The protection diode leakage current corresponds to the basic current of the transistor connected to the next protection diode and the leakage current is correspondingly amplified. Document WO 97/35373 proposes a solution to this problem by decorrelating the isolation and protection functions. The Darlington effect is used to perform the electrostatic discharge evacuation function. The size of the first diode is maximized since the first diode receives the largest part of the discharge. The isolation function is then performed by a MOS transistor connected in series with the last protection diode.

The Darlington effect does not occur in microelectronic circuits made on SOI (silicon on insulator) substrates since parasite bipole transistors are eliminated. Protection by diodes in series can therefore be applied on these substrates.

The article entitled "Dynamic Threshold Body-and Gate-Coupled SOI ESD Protection Networks" by S. VOLDMAN et al. published in EOS/ESD Symposium proceedings, 1997, Santa Clara, Calif., pages 210–220, divulges a protection device using diodes made on an SOI substrate. The protection diodes are then made from MOS transistors. For such a transistor made on SOI substrate, the area under the grid causes a problem due to the fact that the buried insulating layer prevents dissipation of heat, which is contrary to what happens for a solid silicon substrate. This article emphasizes protections in which the diode is made between firstly the drain, substrate and grid, and secondly the source. However, the most compact useable diode consists of an NMOS transistor with a different type of source implant and drain implant. Some manufacturing techniques require a small thickness of silicon on the buried oxide layer, and the formed diodes then have a high resistance. The area under the grid of a protection diode can melt when an electrostatic discharge occurs, since the heat produced cannot easily be dissipated.

PRESENTATION OF THE INVENTION

The invention provides a solution to the problem of protecting microelectronic circuits produced on SOI type substrates. It is applicable to the very particular context of low consumption integrated circuits. The general principle of the invention is to use a device which also has very bad inverse withstand performances and cannot be used in a circuit without modification due to the leaks that it causes. This device is a Zener type diode. This term refers to a diode with a low avalanche voltage. Its bad inverse withstand is not a disadvantage in the case of the invention, since the diode will always be directly polarized.

The Zener diode used according to this invention is a diode formed by the junction between two opposite and highly doped zones. The direct characteristics and the inverse characteristics are correspondingly degraded and the result is that the diode cannot be used in an application for which this type of diode is usually used. Its conduction level at a given voltage is then increased, while its blocking aspect when inversely polarized disappears. Leaks with low polarization voltage are also higher than with a classical diode.

The advantage of Zener diodes is that their intrinsic voltage withstand at an electrostatic discharge is high. This is particularly true in the case of a thin substrate (see FIG. 7). Furthermore they have a lower series resistance and their gain is increased by a factor of 3. These two parameters are essential to optimise protection.

Therefore, the purpose of the invention is a device for protection of an electronic component against electrostatic discharges, the device being made in a semiconducting layer of a substrate, the semiconducting layer covering an insulating layer, the device being connected to a contact pin to protect the said component in order to divert an electrostatic discharge, characterized in that the device comprises at least one Zener diode connected to the said pin to be directly polarized.

In general, this device comprises several Zener diodes mounted in series and connected to the said pin to be directly polarized. The Zener diodes may be laid out adjacent to each other to form the circuit in series, the electric link between two adjacent diodes being obtained by metallisation or by a silicide.

Advantageously, each Zener diode comprises two regions highly doped with opposite types of conductivity, these two regions being separated by a medium doping region according to one or the other of the said types of conductivity. Preferably, if the semiconducting substrate layer is a silicon layer, the doping levels in the two strongly doped regions is of the order of $10^{20}$ atoms/cm$^3$, and the doping level in the region doped at an average level is of the order of $10^{18}$ atoms/cm$^3$. This substrate may be an SOI substrate.

In order to overcome the problem of dissipation of heat from a protection diode made on a semiconducting surface layer supported on an insulating layer that is a poor dissipator of heat (for example an SOI substrate), it is proposed to make this diode without starting from a transistor to avoid the presence of a grid, in order to obtain the greatest volume and thus enable dispersion of heat. The silicon will be thinned if necessary at the grid.

Another purpose of the invention is a process for embodiment of a device for protection of an electronic component against electrostatic discharges, the protection device comprising at least one Zener diode made in a semiconducting layer of a substrate, the semiconducting layer covering an insulating layer, the process comprising:

a step to define the zone of the diode or the active zone, in the said semiconducting layer, a step to implant a first zone in the said active zone, to obtain a first zone with medium doping according to a conductivity type chosen between a first conductivity type and a second conductivity type opposite to the first conductivity type, a step to implant a part of the said first zone, to obtain a second strongly doped zone according to the said first conductivity type, the second zone being separated from the unimplanted part of the active zone by the remaining part of the first zone, a step to implant the unimplanted part of the active zone to obtain a third zone with strong doping according to the said second conductivity type.

Another purpose of the invention is a process for making a device for the protection of an electronic component against electrostatic discharges, the protection device comprising at least one Zener diode made in a semiconducting layer of a substrate, the semiconducting layer covering an insulating layer, the process comprising:

a step to define the zone of the diode or the active zone in the said semiconducting layer, a step to implant a first zone near the central part of the active zone, to obtain a first medium doped zone according to a conductivity type chosen between a first conductivity type and a second conductivity type opposite to the first conductivity type, a step to form a grid made of a conducting material on the first zone, after formation of a thin grid oxide layer, a step to implant a second zone of the active zone adjacent to the first zone, to obtain a second zone with strong doping according to the first conductivity type, a step to implant a third zone in the active zone, adjacent to the first zone that separates it from the second zone, to obtain a third zone with strong doping according to the second conductivity type. Preferably, the first zone is wider than the grid formed on this first zone.

BRIEF DESCRIPTION OF THE DRAWINGS

The invention will be better understood and other advantages and specific features will appear after reading the following description, given as a non-limitative example accompanied by the attached drawings, among which:

FIGS. 8 to 11 are cross sectional views of an SOI substrate during various manufacturing steps of a Zener diode for a protection device according to the invention.

DETAILED DESCRIPTION OF EMBODIMENTS OF THE INVENTION

Figure 1:
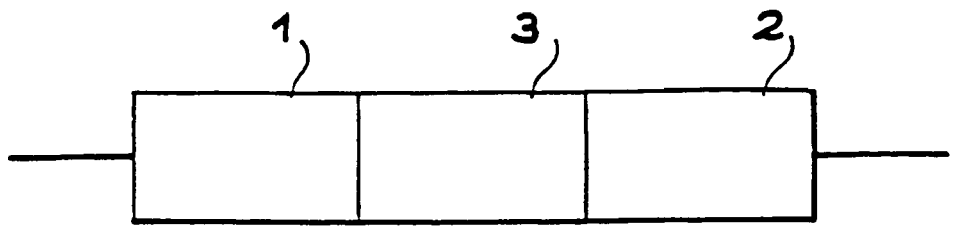
FIG. 1 diagrammatically shows the composition of a Zener diode that can be used in the protection device according to the invention.

FIG. 1 diagrammatically shows the composition of a Zener diode that can be used in the protection device according to the invention. This Zener diode is made from single crystalline silicon using two strong source and drain type implants that can be used to achieve doping of the order of $10^{20}$ atoms/cm$^3$. These two opposite types of implants, N$^{++}$ for region 1 and P$^{++}$ for region 2, are separated by an intermediate N or P type implant in region 3 of the order of $10^{18}$ atoms/cm$^3$. This diode is specific in its design and its low resistance. This Zener diode may be made differently depending on the techniques used.

When a classical diode is made starting from a MOS transistor configuration on a very thin layer of an SOI type substrate, the low intrinsic withstand of the protection diode is explained partly by the lower thickness of silicon due to local thinning. Furthermore, zones with the lowest doping located under spacers can induce a high series resistance of the diode, particularly for implants corresponding to the PMOS transistor.

It is proposed that each Zener diode in the protection device according to the invention should be made as follows, in order to overcome these disadvantages. The polysilicon grid masking level is not used. The implant level used for spacers in the NMOS transistor (slightly doped N or LDDN drain) is dissociated from the N drain and source (DSN) level. The P source drain (DSP) level that is normally the complement of the DSN level, becomes the complement of the DSN and LDDN levels.

Figure 2:
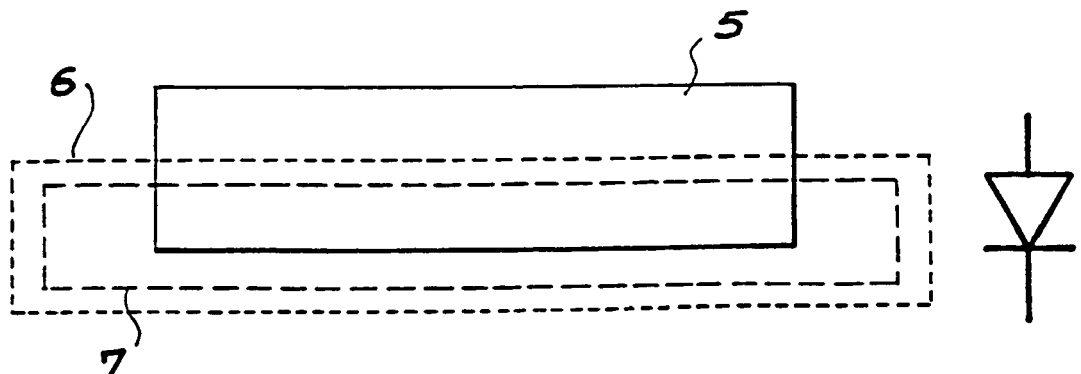
FIG. 2 is a descriptive view of the implant of a Zener diode on a very thin substrate layer that can be used in the protection device according to the invention.

FIG. 2 shows a descriptive view of the implant of a Zener diode on a very thin layer of a substrate. In order to make this diode, an active silicon zone 5 is defined in the silicon surface layer of an SOI substrate. An LDDN type implant level 6, and an $N^{++}$ type implant layer 7 are made. The DSP level is complementary to the DSN and the LDDN levels.

The following table presents the electrical results in terms of ESD withstand and electrical resistance, for a diode according to known art and a Zener diode made using similar techniques and with the same characteristics.

|  | ESD withstand (volts/$\mu$m) | R($\Omega$) |
| --- | --- | --- |
| Diode | 7 V/$\mu$m | 1400 $\Omega$ $\mu$m |
| Zener diode | 11 V/$\mu$m | 470 $\Omega$ $\mu$m |

The intrinsic withstand expressed in volts per micrometer, is a value used in the standard test for protection against electrostatic discharges called HBM (for "Human Body Model"). This test was defined by considering that a person can be represented by a capacitor with a capacitance of 100 pF, the skin resistance varying between 500 and 50 000 $\Omega$. This standard refers to a device mounted in series with a 100 pF capacitor, a 1500 $\Omega$ resistance and implicitly a 7.5 $\mu$H inductance. It is said that a device has a withstand of 2000 V (HBM) if it is not damaged by the discharge of a capacitor charged to 2000 V, this discharge taking place through the 1500 $\Omega$ resistance and the 7.5 $\mu$H inductance. The voltage withstand is then normalized per unit width of the protection device.

With this type of tester, and due to the high value of its series resistance which is 1500 $\Omega$, a voltage transient of U volts actually corresponds to a current transient with a maximum current of about U/1500 amperes, a rise time of 5 to 10 nS and an exponential decay with a time constant of 150 nS. This current transient causes a certain temperature rise due to the Joule effect. The ESD withstand in terms of volts per $\mu$m corresponds to a limit beyond which the energy dissipated in the device causes a destructive temperature runaway. The temperature runaway threshold may be related to a critical temperature that must not be exceeded. The temperature rise in the material during the ESD transient corresponds to dissipation of heat by the Joule effect together with the high current transient. At the same current densities, the temperature rise for the SOI substrate is greater than for a solid substrate, since heat cannot be dissipated as easily through the back of the substrate due to the presence of the buried oxide layer. The increase in the intrinsic withstand implies an increase in the thickness of the surface silicon layer.

In the above table, the gain in terms of intrinsic withstand and electrical resistance of the diode according to the invention, is obvious compared with the classical diode.

For another type of technique, namely thin silicon surface layers, local thinning is not used to make a classical diode produced from a classical MOS transistor. In order to overcome resistance problems under the spacer, at least one specific N type implant is used for the purposes of this invention, together with doping of the same order of magnitude as that used for the intermediate zone of the Zener diode, over the entire active zone. This implant creates doping of a few $10^{18}$ atoms/cm$^3$ and is done instead of the threshold adjustment implant done for a classical diode.

Figure 3:
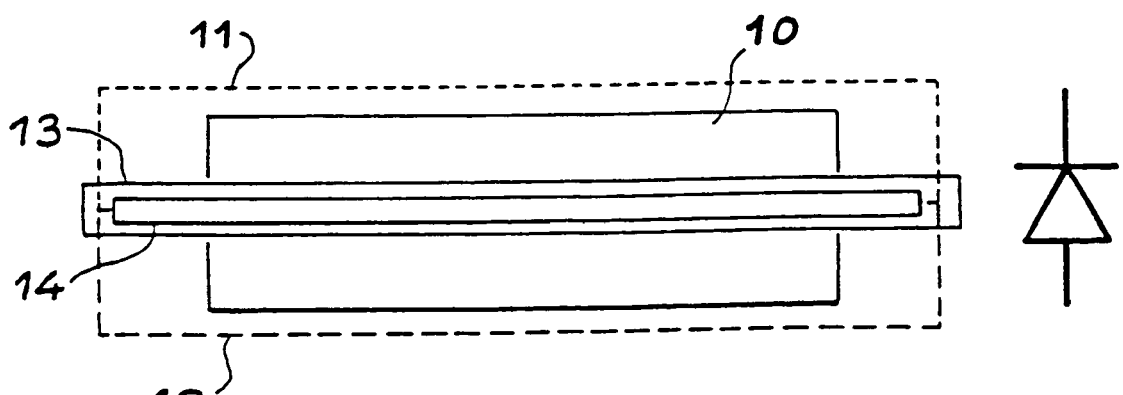
FIG. 3 is a descriptive view of the implant of a Zener diode on a thin layer of a substrate that can be used in the protection device according to the invention.

The implant then used to make the Zener diode according to the invention is shown in FIG. 3. In order to produce this diode, an active silicon zone 10 is defined in the silicon surface layer of an SOI substrate. An $N^{++}$ type implant level 11, a $P^{++}$ type implant level 12, an N type implant level 13 and a polysilicon grid 14 are made.

The protection device using Zener diodes according to the invention cannot be used in the same way as protection devices with classical diodes. Zener diodes in the protection device according to the invention are polarized directly.

Figure 4:
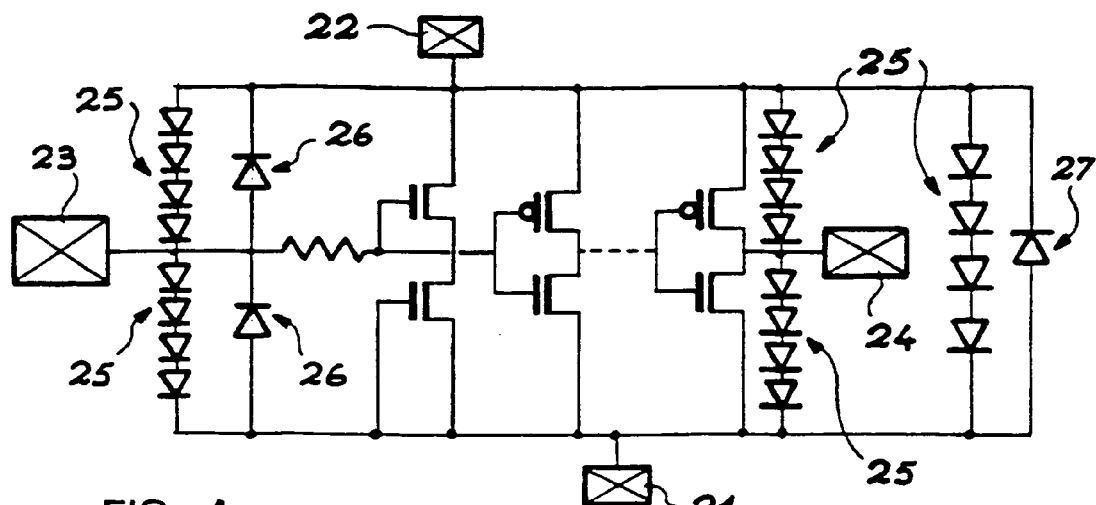
FIG. 4 represents an electronic circuit protected by protection devices according to the invention.

For example, FIG. 4 shows an electronic circuit protected from electrostatic discharges by four protection devices according to the invention. The ground pin 21, the DC power supply pin 22, the circuit input pin 23 and the circuit output pin 24 are connected to protection devices 25. These protection devices 25 are formed from four Zener diodes mounted in series and polarized directly. The number of diodes in a device must be sufficient, in order to resist the power supply voltage without inducing an excessive leakage.

The protection device according to the invention may advantageously be completed by the addition of classical inverse polarized diodes at several locations in the circuit in order to increase the efficiency of the protection regardless of the sign of the electrostatic discharge. Thus, references 26 and 27 denote classical diodes installed in addition to some protection devices according to the invention.

Figure 5:
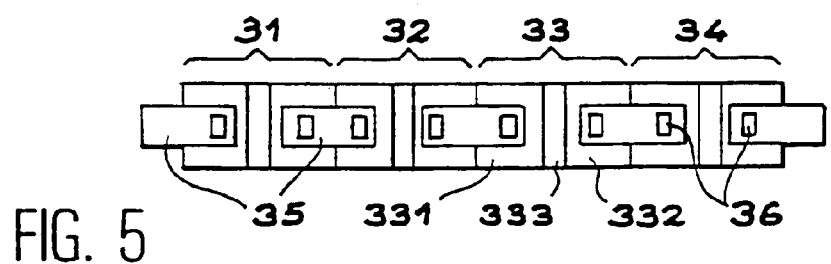
FIG. 5 represents the implant of a set of four Zener diodes mounted in series on a very thin layer of a substrate, for a protection device according to the invention.

Diodes in the protection device shall be mounted in series, consequently it is judicious to design the device to enable the most compact possible integration. This is done by making the four diodes on the same active zone. If the diodes are made using an LDDN level differentiated from the DSN level (see FIG. 2), these diodes can be connected to each other through the metallisation level. This is illustrated in FIG. 5. The four diodes 31, 32, 33 and 34 are shown with their different implants, for example for the Zener diode 33, the DSP implant 331, the DSN implant 332 and the LDDN implant 333. Metallisations 35 connect the diodes to each other and to the outside. References 36 represent electrical contact points between diodes and metallisation.

Figure 6:
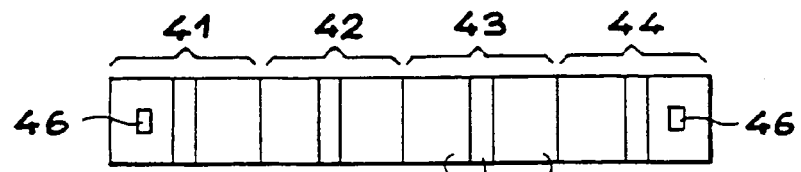
FIG. 6 represents the implant of a set of four Zener diodes mounted in series on a thin layer of a substrate, for a protection device according to the invention.

If the diodes were made using an LDDN type level used in front of the grid, then the diodes can be connected by a silicide level as illustrated in FIG. 6. The result is an even more highly integrated device. The four diodes are referenced 41, 42, 43 and 44. Each diode, for example diode 43, comprises a DSP implant 431, a DSN implant 432 and a polysilicon grid 433. References 46 represent electrical contact points at the input and output of the protection device with four Zener diodes.

Figure 7:
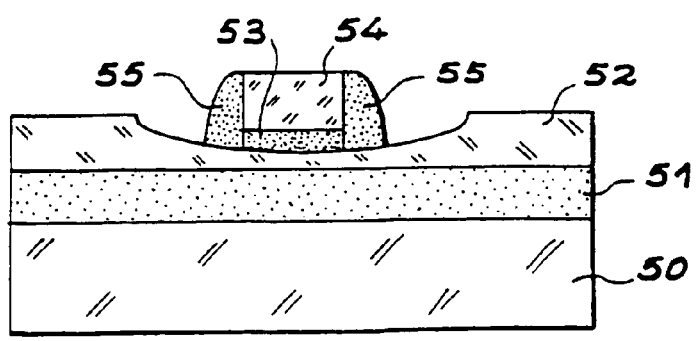
FIG. 7 is a cross sectional view of MOS transistor according to known art.

A classical diode is usually made by producing a MOS transistor. FIG. 7 shows a cross section of such a transistor made on an SOI substrate formed from a solid part 50 made of silicon, a layer of silicon oxide 51 and surface layer of silicon 52. The local thinning area created in the surface layer 52 can be noted. This local thinning area supports the grid oxide layer 53, the polysilicon grid 54 and the spacers 55. Classical diodes are made using this concept and it is obvious that the volume of silicon between the grid oxide 53 and the oxide layer 51 is too confined. The heat produced in this volume cannot easily be dissipated, unlike elements made on the solid silicon substrate.

According to the invention, Zener diodes can be made avoiding local thinning related to the polysilicon grid. The diode is made with a single LDD level as shown in FIG. 2. This is an innovative modification of a standard process since a device is used which also has very bad inverse withstand performances and which cannot be used as such in a circuit due to the leaks that it causes.

FIGS. 8 to 11 illustrate the production of a Zener diode for a protection device according to the invention, starting from an SOI substrate. FIG. 8 shows a cross-section of an SOI substrate composed of a solid part 60 made of silicon, a silicon oxide layer 61 and a silicon surface layer 62. As shown in FIG. 9, an LDDN type implant is made on part of the surface layer 62 to obtain an $N^+$ doped zone 63. As shown in FIG. 10, an N drain-source (DSN) type implant is then made on part of the zone 63 that already has an $N^+$ type doping. This gives a zone 64 with $N^{++}$ doping. A P drain-source type (DSP) implant is then made in zone 65 in order to complete the Zener diode, as shown in FIG. 11.

In general, the doping in the different zones forming a Zener diode in the device according to the invention will be greater than or equal to $10^{13}$ atoms/cm$^3$.

This Zener diode design is inexpensive, since, although it obviously needs an additional reticle, the LDDN level is dissociated from the DSN level and the resulting production process is not more complex. The protection function is optimised; the intrinsic withstand is increased and the voltage drop developed at the terminals of the protection diode during an electrostatic discharge is minimized. This is shown in the table shown above: 60% gain on the intrinsic withstand and 200% gain on the electrical resistance, which is actually the most critical parameter.

The invention succeeded in reaching a compromise. As doping on the LDD side increases, the avalanche voltage reduces and the direct trip voltage also reduces. The result is better evacuation of the electrostatic discharge wave.

The isolation capacity reduces as the doping increases. This type of diode made with these non-classical characteristics result in structures that produce high leakage currents but when put in series the isolation capacity is compensated and these diodes are very efficient in evacuating charges.

The invention has the following advantage: when the power supply voltage decreases down to 1 V, the result obtained using two degraded diodes mounted in series provides an excellent protection with low resistance. The inventor of this invention has proved an initial assumption by using a very bad quality of this component.

What is claimed is:

1. Device for protection of an electronic component against electrostatic discharges, comprising:
   a plurality of Zener diodes formed in a semiconducting layer of a substrate, the semiconducting layer covering an insulating layer and having two regions of heavy doped opposite conductivity types with at least one of the two regions extending to the insulating layer; and
   a contact pin connected to the electronic component and connected through the Zener diodes to ground in order to divert an electrostatic discharge and thereby protect the electronic component, wherein
   said plurality of Zener diodes are connected in series and are disposed so as to be directly polarized.

2. Device according to claim 1, wherein said plurality of Zener diodes are mounted in series and connected to the contact pin.

3. Device according to claim 2, wherein the plurality of the Zener diodes is laid out adjacent to each other to form a series installation, and an electrical link between two adjacent Zener diodes is obtained by a metallization.

4. Device according to claim 2, wherein the plurality of the Zener diodes are laid out adjacent to each other to form a series installation, and an electrical link between two adjacent Zener diodes is obtained by a silicide.

5. Device according to claim 1, wherein the two regions of heavy doped opposite conductivity types are separated by a region doped to an average level according to either of the opposite conductivity types.

6. Device according to claim 5, wherein the semiconducting layer comprises a silicon layer, the two regions of heavy doped opposite conductivity types comprise doping of the order of $10^{20}$ atoms/cm$^3$, and the region doped to an average level comprises doping of the order of $10^{18}$ atoms/cm$^3$.

7. Device according to claim 1, wherein the substrate is a silicon-on-insulator SOI substrate.

* * * * *

UNITED STATES PATENT AND TRADEMARK OFFICE
CERTIFICATE OF CORRECTION

PATENT NO. : 6,969,891 B1
DATED : November 29, 2005
INVENTOR(S) : Leroux

It is certified that error appears in the above-identified patent and that said Letters Patent is hereby corrected as shown below:

Title page,
Item [86], should read:

-- [86]  PCT No.:    PCT/FR00/00198

§ 371 (c)(1),
(2), (4) Date:  Jul. 27, 2001 --.

Signed and Sealed this

Fourteenth Day of February, 2006

JON W. DUDAS
*Director of the United States Patent and Trademark Office*